(12) United States Patent
Tu et al.

(10) Patent No.: US 8,008,687 B2
(45) Date of Patent: Aug. 30, 2011

(54) ELECTROSTATIC DISCHARGE PROTECTION DEVICE

(75) Inventors: Shang-Hui Tu, Tainan (TW); Hung-Shern Tsai, Tainan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 253 days.

(21) Appl. No.: 12/472,091

(22) Filed: May 26, 2009

(65) Prior Publication Data

US 2010/0301385 A1 Dec. 2, 2010

(51) Int. Cl.
H01L 29/66 (2006.01)
(52) U.S. Cl. ........ 257/119; 257/124; 257/173; 257/355; 257/E27.031; 257/E29.024
(58) Field of Classification Search .................. 257/119, 257/124, 126, 128, 173, 175, 355, 360, 546, 257/E27.031, E29.024
See application file for complete search history.

(56) References Cited

U.S. PATENT DOCUMENTS

2002/0074602 A1* 6/2002 Lin et al. ........................ 257/355

* cited by examiner

Primary Examiner — Evan Pert
Assistant Examiner — Scott R Wilson

(57) ABSTRACT

An electrostatic discharge protection device including a substrate, a first doped region, a first gate electrode, a second doped region, a second gate electrode, and a third doped region is disclosed. The substrate has a first conductive type. The first doped region has a second conductive type and is formed in the substrate. The first gate electrode is formed on the substrate. The second doped region has the second conductive type and is formed in the substrate. A transistor is constituted by the first doped region, the first gate electrode, and the second doped region. The second gate electrode is formed on the substrate. The first and the second gate electrodes are separated. The third doped region has the first conductive type and is formed in the substrate. A discharge element is constituted by the first doped region, the second gate electrode, and the third doped region.

21 Claims, 6 Drawing Sheets

US 8,008,687 B2

ELECTROSTATIC DISCHARGE PROTECTION DEVICE

BACKGROUND OF THE INVENTION

1. Field of the Invention

The invention relates to an electrostatic discharge (ESD) protection device, and more particularly to an ESD protection device for high voltages.

2. Description of the Related Art

As semiconductor manufacturing develops, electrostatic discharge (ESD) protection has become one of the most critical reliability issues for integrated circuits (IC). Several ESD test modes, such as machine mode (MM) or human body mode (HBM), have been proposed to imitate the circumstances under which an ESD event may occur. The ability to withstand certain levels of ESD is essential for successful commercialization of an IC.

ESD protection circuits are generally located at input/output ports or between power rails of ICs, to release electrostatic stress before the electrostatic stress damages interior or core electronic circuits therein. ESD protection circuits are typically designed to be switched off during common/normal signal operation and switched on during an ESD event to release accumulated electrostatic charge.

To sustain a high voltage, the conventional ESD element is typically constituted by a high voltage element of a corresponding circuit. However, the track of the high voltage element affects the distribution of the electric field. Thus, a corresponding circuit may be damaged.

The conventional method to solve the ESD problem for high voltages is to design a terminal of the high voltage element into a separate pad. However, the ESD element also requires a separate pad. Thus, complexity of the circuit layout is increased and size of the corresponding circuit is also increased.

BRIEF SUMMARY OF THE INVENTION

Electrostatic discharge protection devices are provided. An exemplary embodiment of an electrostatic discharge protection device comprises a substrate, a first doped region, a first gate electrode, a second doped region, a second gate electrode, and a third doped region. The substrate has a first conductive type. The first doped region has a second conductive type and is formed in the substrate. The first gate electrode is formed on the substrate. The second doped region has the second conductive type and is formed in the substrate. A transistor is constituted by the first doped region, the first gate electrode, and the second doped region. The second gate electrode is formed on the substrate. The first and the second gate electrodes are separated. The third doped region has the first conductive type and is formed in the substrate. A discharge element is constituted by the first doped region, the second gate electrode, and the third doped region.

Another exemplary embodiment of an electrostatic discharge protection device comprises a substrate, a first doped region, a first gate electrode, a second doped region, a third doped region, and a fourth doped region. The substrate has a first conductive type. The first doped region has a second conductive type and is formed in the substrate. The first gate electrode is formed on the substrate. The second doped region has the second conductive type and is formed in the substrate. A transistor is constituted by the first doped region, the first gate electrode, and the second doped region. The third doped region has the first conductive type and is formed in the substrate. The second and the third doped regions are separated. The fourth doped region has the second conductive type and is formed in the substrate. The second and the fourth doped regions are separated. A discharge element is constituted by the first, the third, and the fourth doped regions and the second gate electrode.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
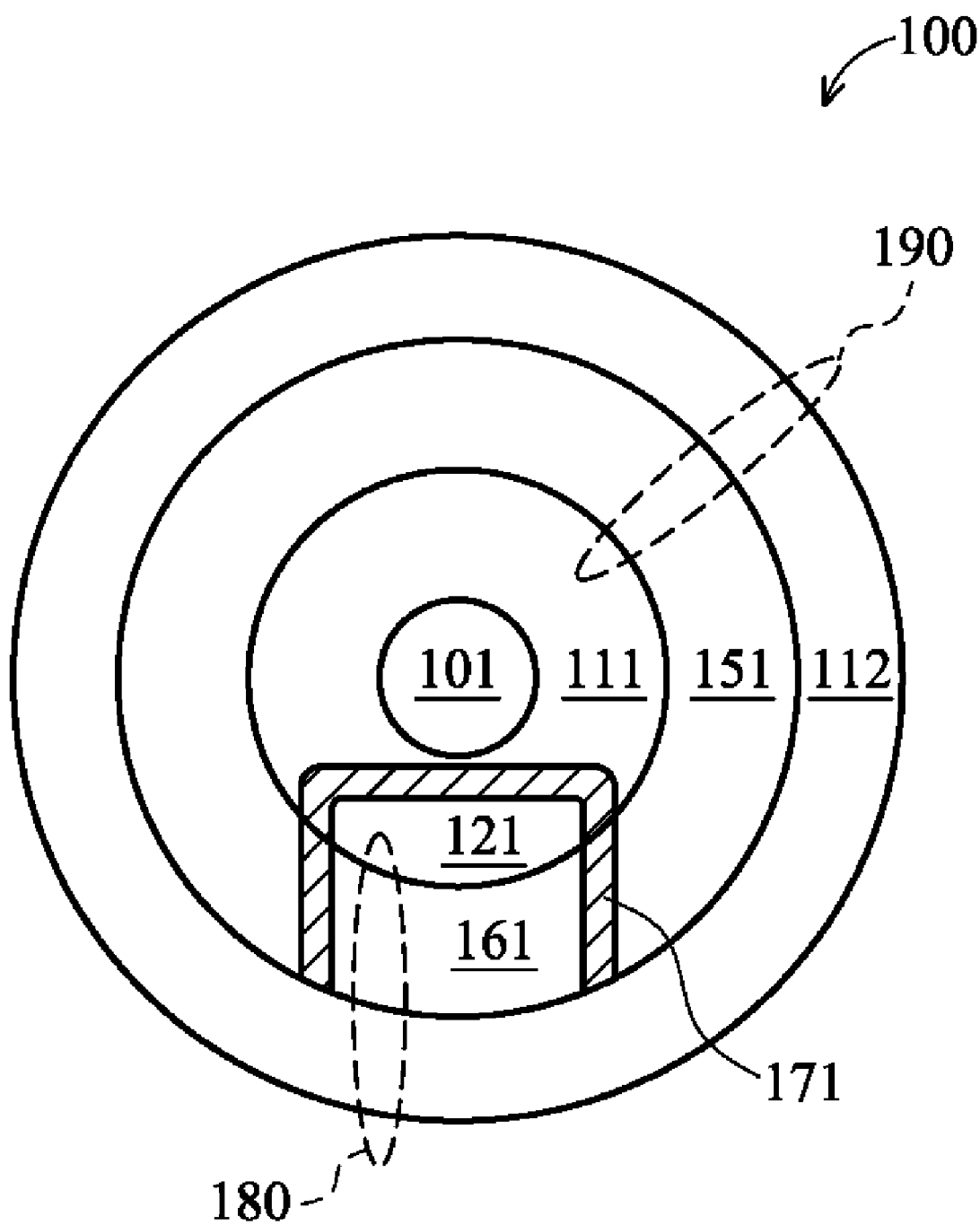
FIG. 1A is a schematic diagram of an exemplary embodiment of an ESD protection device of the invention.

FIG. 1A is a schematic diagram of an exemplary embodiment of an ESD protection device of the invention. The ESD protection device 100 comprises a substrate (not shown), doped regions 111, 112, and 121, and gate electrodes 151 and 161. In this embodiment, the doped regions 111 and 121 are separated. The gate electrodes 151 and 161 are separated. In another embodiment, the doped region 111 is formed in a first well and the doped region 121 is formed in a second well. The first and the second wells are separated.

The doped region 111, the gate electrode 151, and the doped regions 112 constitute a transistor 190. The transistor 190 is a high voltage element, which is capable of sustaining high voltage, such as 200V and above. In this embodiment, the doped region 111 serves as a drain of the transistor 190. The doped region 112 serves as a source of the transistor 190. The gate electrode 151 serves as a gate of the transistor 190. In one embodiment, the transistor 190 is a Laterally Diffused Metal Oxide Semiconductor Field Effect Transistor (LDMOS FET).

The doped region 121, the gate electrode 161, and the doped region 112 constitute a discharge element 180. The discharge element 180 is a high voltage element. The discharge element 180 is an Insulated Gate Bipolar Transistor (IGBT) or a Silicon Controlled Rectifier (SCR) according to the conductive type of the doped region 112. The doped region 121 serves as a drain of the discharge element 180. The doped region 112 serves as a source of the discharge element 180. The gate electrode 161 serves as a gate of the discharge element 180.

In a protection mode (ESD event occurs), the transistor 190 is de-activated and the discharge element 180 is activated to release ESD current generated by the ESD event. In this embodiment, since the doped regions 111 and 121 are separated, when the transistor 190 is activated, the current generated by the transistor 190 does not affect the discharge element 180 in a normal mode (ESD event does not occur).

In this case, when the ESD event does not occur, the discharge element 180 is de-activated and the transistor 190 is activated. In one embodiment, the transistor 190 may be a startup element to provide operation voltage to the corresponding circuit.

In this embodiment, the ESD protection device 100 further comprises a doped region 171 to isolate the doped regions 111 and 121. In another embodiment, the doped region 171 further isolates the gate electrodes 151 and 161. In other embodiments, the ESD protection device 100 further comprises an input/output pad 101. The input/output pad 101 is formed on the doped region 111.

The doped regions 111 and 121 form a circular structure to surround the input/output pad 101. The gate electrodes 151 and 161 form another circular structure to surround the doped regions 111 and 121. Similarly, the doped region 112 forms a circular structure to surround the gate electrodes 151 and 161.

Figure 1B:
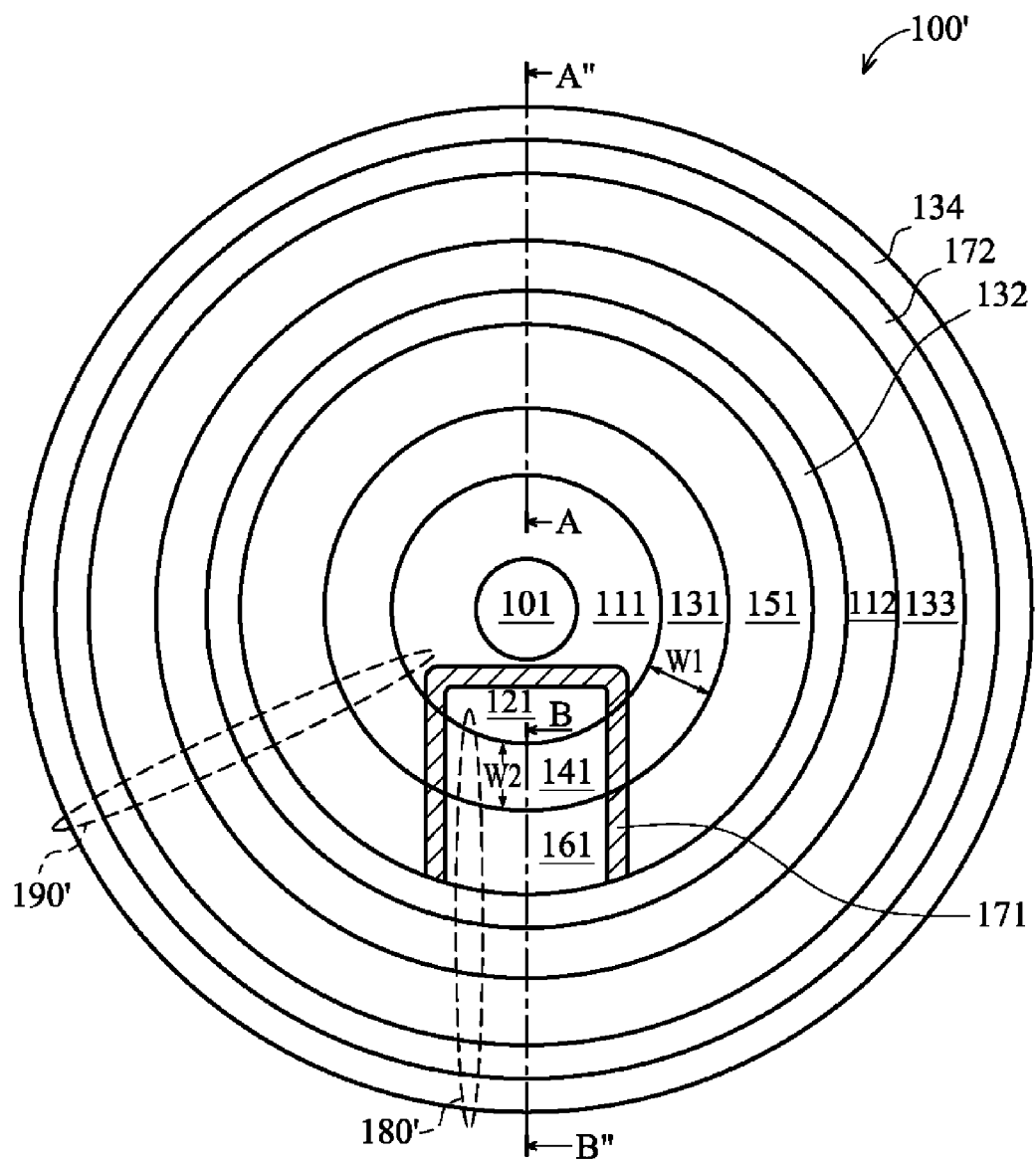
FIG. 1B is a schematic diagram of another exemplary embodiment of an ESD protection device of the invention.

FIG. 1B is a schematic diagram of another exemplary embodiment of an ESD protection device of the invention. FIG. 1B is similar to FIG. 1A with the exception that the ESD protection device 100' comprises field oxides 131-134, 141 and a doped region 172. The doped region 172 has a first conductive type to serve as bulks of the transistor 190' and the discharge element 180'.

The field oxides 131 and 141 are separated and form a circular structure to surround the doped regions 111 and 121. The field oxide 132 surrounds the gate electrodes 151 and 161. In this embodiment, the doped region 171 isolates the field oxides 131 and 141. The field oxide 133 surrounds the doped region 112. The doped region 172 surrounds the field oxide 133. The field oxide 134 surrounds the doped region 172.

In this embodiment, the width W1 of the field oxide 131 is equal to the width W2 of the field oxide 141. Thus, the discharge element 180' is activated before the transistor 190 to release ESD current during the protection mode. In some embodiments, the width W1 of the field oxide 131 is wider than the width W2 of the field oxide 141.

Figure 2:
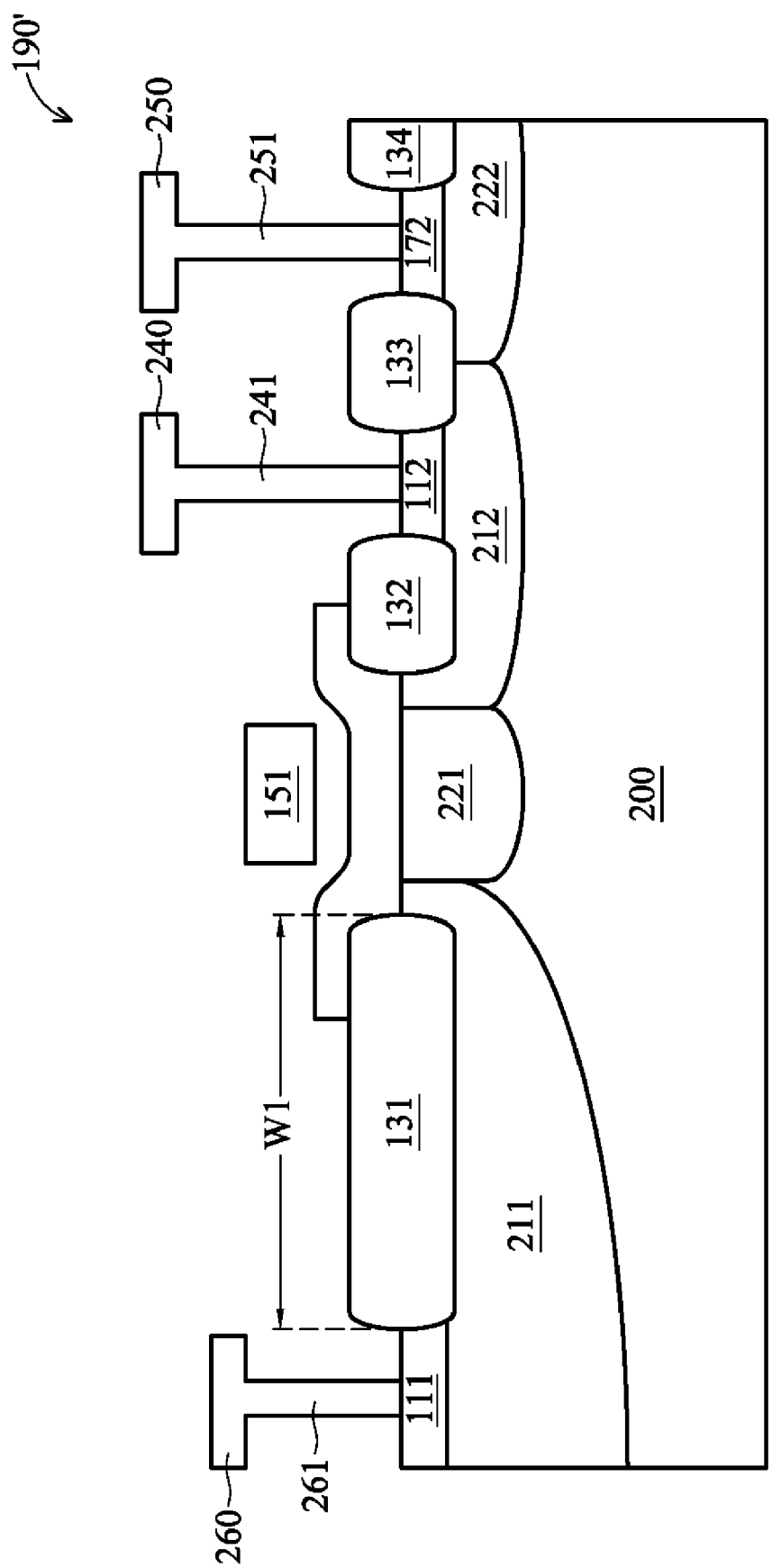
FIG. 2 is a cross section of A-A" shown in FIG. 1B.

FIG. 2 is a cross section of A-A" (i.e. the transistor 190') shown in FIG. 1B. The doped regions 111, 112, and 172 are formed in the substrate 200. The gate electrode 151 is formed on the substrate 200. In one embodiment, the conductive type of each of the substrate 200 and the doped region 172 is a P type. The conductive type of each of the doped regions 111 and 112 is an N type. Thus, the transistor 190' is an N type LDMOS FET.

The field oxide 131 is disposed between the doped region 111 and the gate electrode 151. Additionally, the doped region 111 and the field oxide 131 are formed in the well 211. In this embodiment, the well 211 is a deep N type well. The doped concentration of the doped region 111 is higher than the well 211.

The well 221 is formed between the wells 211 and 212. The well 221 is a P type well. The field oxide 132 and the doped region 112 are formed in the well 212. The well 212 is an N type well. The doped concentration of the doped region 112 is higher than the well 212. The doped region 172 is formed in the well 222. The well 222 is a P type well. The doped concentration of the doped region 172 is higher than the well 222.

In this embodiment, the metal layer 240 is electrically connected to the doped region 112 via the pug 241. The metal layer 250 is electrically connected to the doped region 172 via the pug 251. The metal layer 260 is electrically connected to the doped region 111 via the pug 261. In one embodiment, the metal layer 260 is electrically connected to the input/output pad (shown in FIG. 1A or 1B) 101.

Figure 3A:
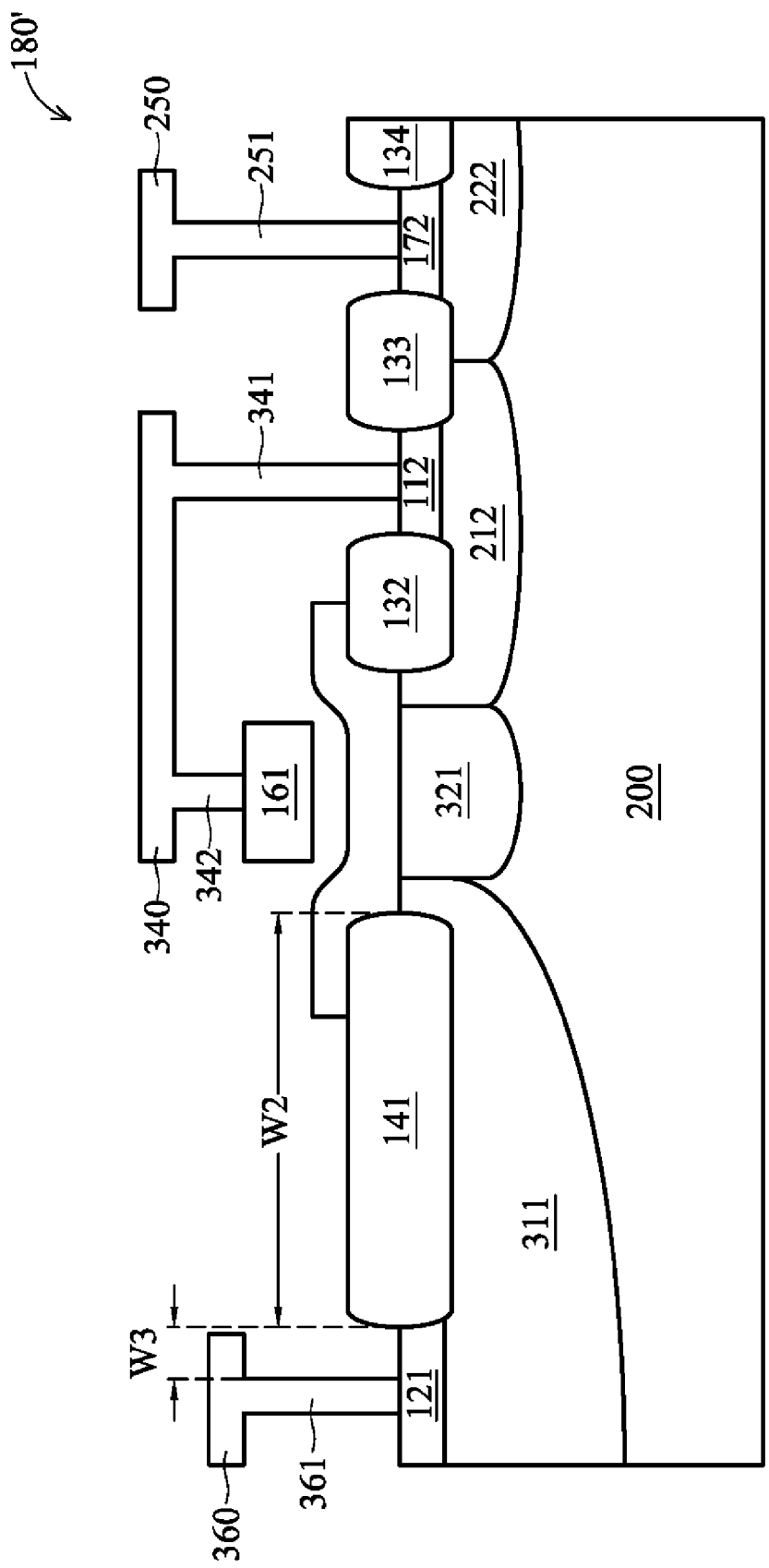
FIG. 3A is a cross section of B-B" shown in FIG. 1B.

FIG. 3A is a cross section of B-B" (i.e. the discharge element 180') shown in FIG. 1B. The doped regions 121, 112, and 172 are formed in the substrate 200. The gate electrode 161 is formed on the substrate 200. In one embodiment, the conductive type of each of the substrate 200, the doped regions 121 and 172 is a P type. The conductive type of the doped region 112 is an N type. The doped concentration of the doped regions 121 and 172 are higher than the substrate 200.

In this embodiment, the discharge element 180' is an IGBT. The doped region 121 serves as a drain of the IGBT. The gate electrode 161 serves as a gate of the IGBT. The doped region 112 serves as a source of the IGBT. The doped region 172 serves as a bulk of the IGBT.

Referring to FIG. 3A, the field oxide 141 is disposed between the doped region 121 and the gate electrode 161. The doped region 121 and the field oxide 141 are formed in the well 311. In this embodiment, the well 311 is a deep N type well. The wells 311 and 211 (shown in FIG. 2) are separated. The doped concentration of the doped region 121 is higher than the well 311.

The well 321 is formed between the wells 311 and 212. The well 321 is a P type well. The doped concentration of the well 321 is lower than the doped region 121. The field oxide 132 and the doped region 112 are formed in the well 212. The well 212 is an N type well. The doped concentration of the doped region 112 is higher than the well 212. The doped region 172 is formed in the well 222. The well 222 is a P type well. The doped concentration of the doped region 172 is higher than the well 222.

In this embodiment, the metal layer 340 is electrically connected to the doped region 112 and the gate electrode 161 via the plugs 341 and 342. The metal layer 360 is connected to the doped region 121 via the plug 361. In this embodiment, the metal layer 360 also electrically connects to the input/output pad (shown in FIG. 1A or 1B) 101. The trigger voltage of the discharge element is controlled according to the width W3 between the plug 361 and the field oxide 141. Thus, the discharge element 180' is activated before the transistor 190' to release ESD current in the protection mode (ESD event occurring).

Figure 3B:
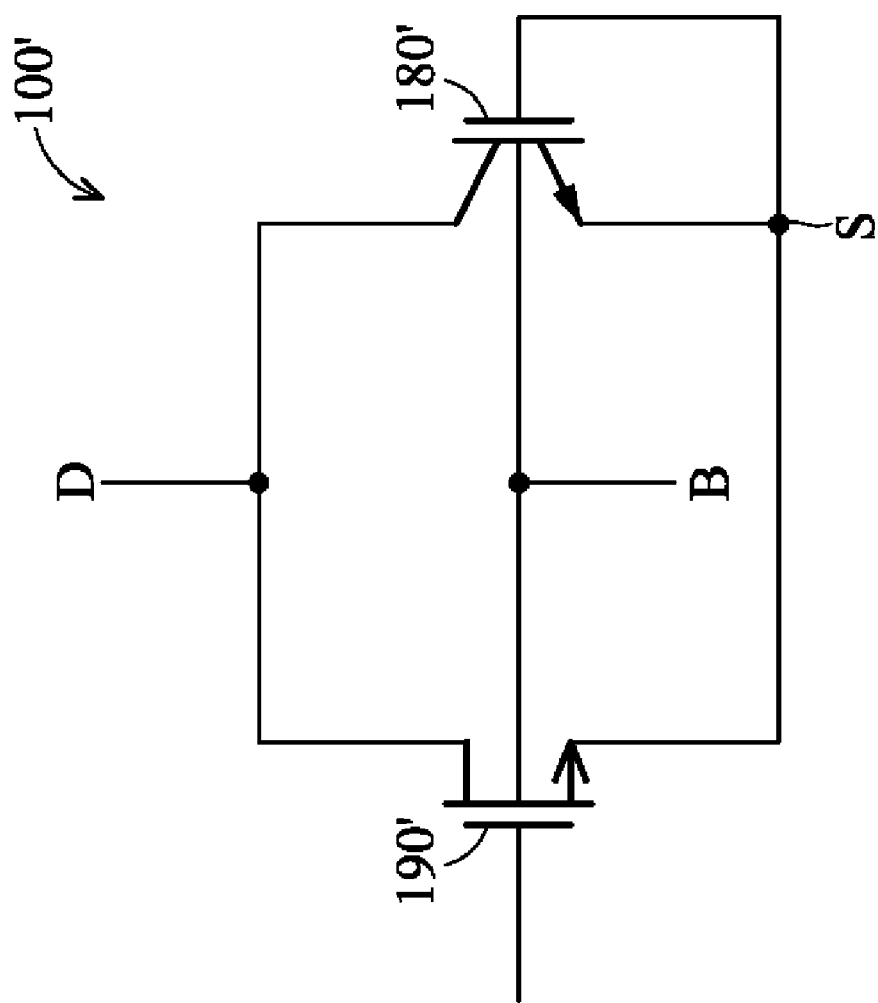
FIG. 3B is a schematic diagram of the ESD protection device of the invention.

FIG. 3B is a schematic diagram of the ESD protection device of the invention. The ESD protection device 100' comprises a discharge element 180' and a transistor 190'. In this embodiment, the discharge element 180' is an N type IGBT and the transistor 190' is an N type LDMOS FET.

The bulk of the transistor 190' is coupled to the bulk of the discharge element 180'. The drain of the transistor 190' is coupled to the drain of the discharge element 180'. In one embodiment, the drain of the discharge element 180' is coupled to an input/output pad. The source of the transistor 190' is coupled to the source of the discharge element 180'. In one embodiment, the source of the discharge element 180' is a grounding level. Thus, the discharge element 180' releases the ESD current to grounding when an ESD event occurs in the input/output pad.

Figure 4:
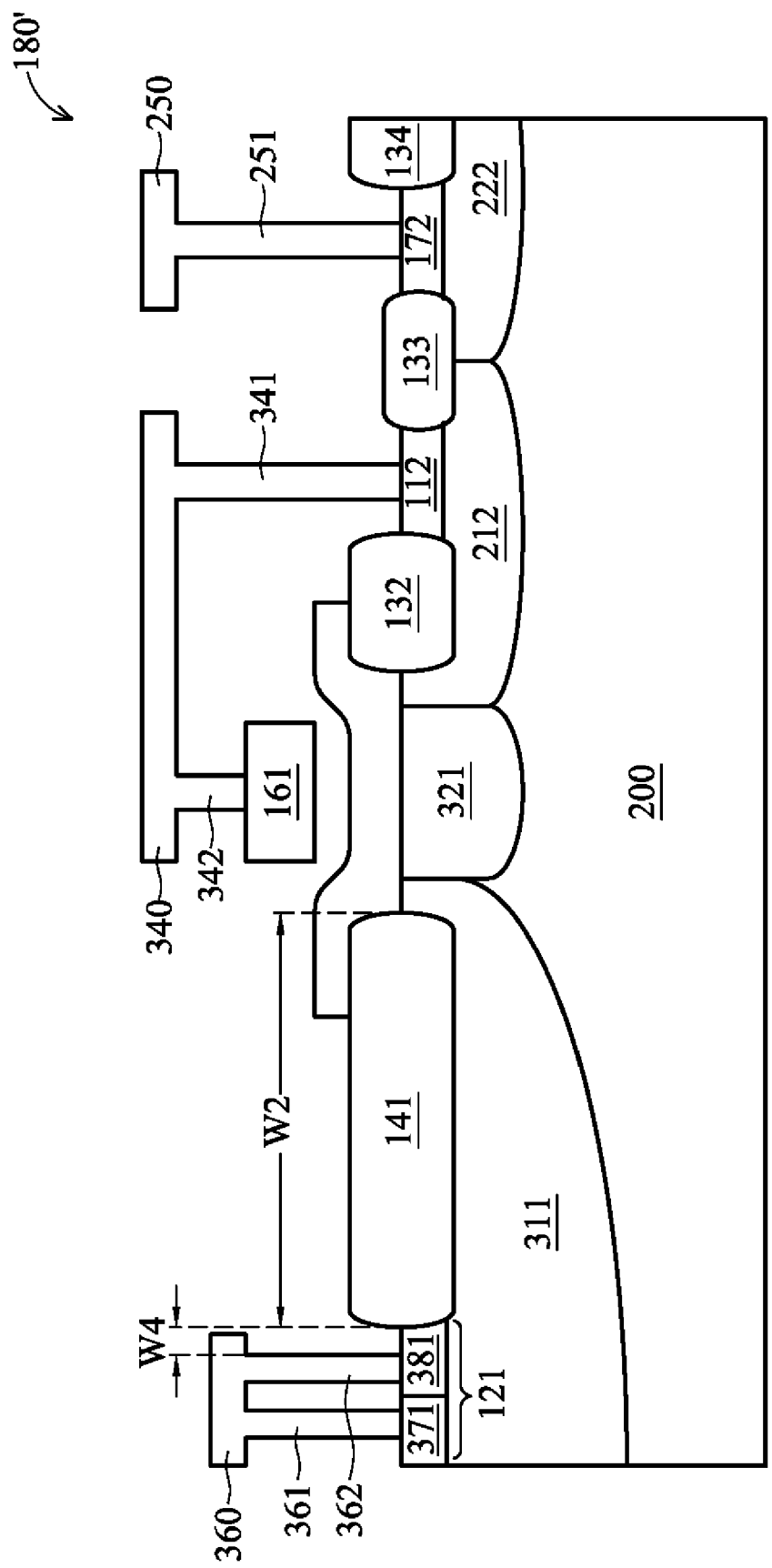
FIG. 4 is a schematic diagram of another exemplary embodiment of the discharge element of the invention.

FIG. 4 is a schematic diagram of another exemplary embodiment of the discharge element 180' of the invention. FIG. 4 is similar to FIG. 3A with the exception that the doped region 121 comprises the doped regions 371 and 381. The conductive type of the doped region 371 is a P type. The conductive type of the doped region 381 is an N type. The doped concentration of the doped region 371 is higher than the substrate 200. The doped concentration of the doped region 381 is higher than the well 311.

In this embodiment, the discharge element 180' is a silicon controlled rectifier (SCR). The metal layer 360 is electrically connected to the doped regions 371 and 381 via the plugs 361 and 362 to serve as the drain of the SCR. The trigger voltage of the SCR is controlled according to the width W4 between the plug 362 and the field oxide 141. The gate electrode 161 is electrically connected to the doped region 112 via the metal layer 340 to serve as the gate of the SCR. The doped region 172 serves as the bulk of the SCR.

Since the doped region 171 isolates the doped regions 371 and 381 from the doped region 111, the current generated by the transistor 190' does not affect the discharge element 180' in the normal mode (i.e. the ESD event does not occur). In addition, the ESD protection device has a circular structure such that the ESD protection device is capable of sustaining high voltage.

Furthermore, the required discharge element can be obtained by adjusting the conductive type of the doped region 121. For example, when the conductive type of the doped region 121 is a P type (i.e. FIG. 3B), the discharge element is an IGBT. When conductive type of the doped region 121 comprises a P type and an N type (i.e. FIG. 4), the discharge element is a SCR.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device, comprising:
    a substrate having a first conductive type;
    a first doped region having a second conductive type and formed in the substrate;
    a first gate electrode formed on the substrate;
    a second doped region having the second conductive type and formed in the substrate, wherein a transistor is constituted by the first doped region, the first gate electrode, and the second doped region;
    a second gate electrode formed on the substrate, wherein the first and the second gate electrodes are separated;
    a third doped region having the first conductive type and formed in the substrate, wherein a discharge element is constituted by the first doped region, the second gate electrode, and the third doped region; and
    a fourth doped region having the first conductive type and formed in the substrate for isolating the second and the third doped regions, wherein the fourth doped region further isolates the first and the second gate electrodes.

2. The electrostatic discharge protection device as claimed in claim 1, wherein the transistor is a laterally diffused metal oxide semiconductor field effect transistor (LDMOS FET) and the discharge element is an insulated gate bipolar transistor (IGBT).

3. The electrostatic discharge protection device as claimed in claim 2, wherein the first doped region serves as a source of the transistor and the second doped region serves as a drain of the transistor.

4. The electrostatic discharge protection device as claimed in claim 3, wherein the first doped region serves as a source of the discharge element and the third doped region serves as a drain of the discharge element.

5. The electrostatic discharge protection device as claimed in claim 1, further comprising a metal layer electrically connecting the second gate electrode and the first doped region.

6. The electrostatic discharge protection device as claimed in claim 1, further comprising an input/output pad formed on the second doped region.

7. The electrostatic discharge protection device as claimed in claim 1, further comprising:
    a first field oxide formed between the first gate electrode and the second doped region; and
    a second field oxide formed between the second gate electrode and the third doped region.

8. The electrostatic discharge protection device as claimed in claim 7, wherein the width of the second field oxide is narrower than or equal to the width of the first field oxide.

9. The electrostatic discharge protection device as claimed in claim 7, wherein the first and the second field oxides are separated.

10. The electrostatic discharge protection device as claimed in claim 1, wherein the first conductive type is a P type and the second conductive type is an N type.

11. An electrostatic discharge protection device, comprising:
    a substrate having a first conductive type;
    a first doped region having a second conductive type and formed in the substrate;
    a first gate electrode formed on the substrate;
    a second doped region having the second conductive type and formed in the substrate, wherein a transistor is constituted by the first doped region, the first gate electrode, and the second doped region;
    a third doped region having the first conductive type and formed in the substrate, wherein the second and the third doped regions are separated; and
    a fourth doped region having the second conductive type and formed in the substrate, wherein the second and the fourth doped regions are separated, and a discharge element is constituted by the first, the third, and the fourth doped regions and the second gate electrode, wherein the transistor is a laterally diffused metal oxide semiconductor field effect transistor (LDMOS FET) and the discharge element is a silicon controlled rectifier (SCR).

12. The electrostatic discharge protection device as claimed in claim 11, further comprising a fifth doped region having the first conductive type and formed in the substrate for isolating the second doped region from the third and the fourth doped regions.

13. The electrostatic discharge protection device as claimed in claim 11, wherein the first doped region serves as a source of the transistor and the second doped region serves as a drain of the transistor.

14. The electrostatic discharge protection device as claimed in claim 11, wherein the first doped region serves as a source of the discharge element and the third and the fourth doped regions are served as a drain of the discharge element.

15. The electrostatic discharge protection device as claimed in claim 11, further comprising a metal layer electrically connecting to the second gate electrode and the first doped region.

16. The electrostatic discharge protection device as claimed in claim 11, further comprising an input/output pad formed on the second doped region.

17. The electrostatic discharge protection device as claimed in claim 11, further comprising:
    a first field oxide formed between the first gate electrode and the second doped region; and a second field oxide formed between the second gate electrode and the fourth doped region.

18. The electrostatic discharge protection device as claimed in claim 17, wherein the width of the second field oxide is narrower than or equal to the width of the first field oxide.

19. The electrostatic discharge protection device as claimed in claim 17, wherein the first and the second field oxide are separated.

20. The electrostatic discharge protection device as claimed in claim 11, further comprising a metal layer electrically connecting to the third and the fourth doped regions.

21. The electrostatic discharge protection device as claimed in claim 11, wherein the first conductive type is a P type and the second conductive type is an N type.

* * * * *